United States Patent [19]

Hartmann et al.

[11] Patent Number: 4,682,403

[45] Date of Patent: Jul. 28, 1987

[54] METHOD FOR INTERCONNECTING THE ACTIVE ZONES AND GATES OF CMOS INTEGRATED CIRCUITS

[75] Inventors: Joël Hartmann, Claix; Pierre Jeuch, Seyssins, both of France

[73] Assignee: Commissariat a l'Energie Atomique, Paris, France

[21] Appl. No.: 715,512

[22] Filed: Mar. 25, 1985

[30] Foreign Application Priority Data

Mar. 30, 1984 [FR] France ............................... 84 05052

[51] Int. Cl.⁴ .................. H01L 21/90; H01L 21/441; H01L 21/443; H01L 29/62
[52] U.S. Cl. ........................................ 29/571; 29/591; 156/643; 427/89
[58] Field of Search ...................... 29/571, 576 B, 578, 29/579, 589, 590, 591; 148/1.5, DIG. 26, DIG. 20, DIG. 106; 156/643; 427/88, 89, 90, 91

[56] References Cited

U.S. PATENT DOCUMENTS

| | | | |
|---|---|---|---|
| 4,305,200 | 12/1981 | Fu et al. | 29/571 |
| 4,441,247 | 4/1984 | Gargini et al. | 29/571 |
| 4,478,679 | 10/1984 | Cheny et al. | 427/90 X |
| 4,519,126 | 5/1985 | Hsu | 29/591 X |
| 4,536,944 | 8/1985 | Bracco et al. | 29/526 B X |

FOREIGN PATENT DOCUMENTS 3223858 1/1983 Fed. Rep. of Germany .

OTHER PUBLICATIONS

Cooke, "A Review of LPCVD Metallization for Semiconductor Devices", Vacuum, vol. 35, No. 2, pp. 67–73, Feb. 1983.
"CVD Tungsten Interconnect and Contact Barrier Technology for VLSI", Solid State Technology, vol. 25, Dec. 1982, pp. 85–90, Miller and Beinglass.

Primary Examiner—Olik Chaudhuri
Attorney, Agent, or Firm—Cesari and McKenna

[57] ABSTRACT

A method for interconnecting the active zones and/or gates of CMOS integrated circuits. The method comprises, during the formation of the gates in a first conductive coating, defining in the latter the dimensions of the connections to be produced, and wherein following the formation of the active zones, the gates are laterally insulated and then a second conductive coating producing the desired connections is deposited on the complete circuit, with the exception of the lateral insulation.

7 Claims, 6 Drawing Figures

METHOD FOR INTERCONNECTING THE ACTIVE ZONES AND GATES OF CMOS INTEGRATED CIRCUITS

BACKGROUND OF THE INVENTION

The present invention relates to a method for interconnecting the active zones and/or the gates of a C/MOS integrated circuit. This method more particularly makes it possible to carry out short distance connections between the sources and drains of MOS transistors (metal-oxide-semiconductor) with a n or p channel entering into the constituting of C/MOS integrated circuits (complementary MOS) and also for connecting the sources and/or drains to the gates of said same transistors.

C/MOS integrated circuits, the simplest of which is an inverter, formed solely by a n channel transistor and a p channel transistor, one of which is conductive and the other non-conductive and vice versa, have the advantage of consuming very little electric power. However, they suffer from a limited integration density. This integration density is more particularly linked with the necessity of frequently connecting type n+ regions (source or drain of a n channel transistor) and type p+ regions (source or drain of p channel transistor), which is explained by the fact that each elementary gate of the integrated circuit has both n channel transistors and p channel transistors.

FIG. 1 shows in longitudinal sectional form a C/MOS inverter for illustrating the prior art method.

After forming the constituent elements of the integrated circuit, i.e. the active zones such as sources 2 and 8 and drains 4 and 6 of the transistors of the circuit, gates 12 and 14 of said transistors and the field oxide 16, an insulating coating 18, generally of silicon oxide, is deposited on the complete integrated circuit and is then etched, so as to form electric contact holes such as 20 and 22 for the active zones and the gates. This is followed by the deposition on the etched insulated coating 18 of a generally aluminium conductive coating 24. The latter is then etched to form the desired connection, such as connection 24a between the n channel transistor drain 4 and the p channel transistor drain 6, of the inverter.

In such a method, apart from the surface occupied by the actual connections, it is essentially the electric contact holes 20, 22 made in the insulating coating and the guards 26, 27 necessary for positioning these holes, which reduce the integration density of the C/MOS integrated circuit.

In order to increase the integration density of such C/MOS circuits, particularly by reducing the surface occupied by the connections, sometimes circuits with two connection levels are produced, generally from aluminium. However, this significantly complicates the production process for the circuits and does not make it possible to eliminate the problems caused by the electric contact holes in the insulating coating.

SUMMARY OF THE INVENTION

The present invention relates to a method for interconnecting the active zones and/or gates of the C/MOS integrated circuits making it possible to obviate these disadvantages, whilst in particular making it possible to significantly increase the integration density of said circuits.

After producing the constituent elements of the integrated circuit, such as the active zones, the gates and the field oxide, this method more particularly makes it possible to produce the various desired connection, without having previously deposited on the complete integrated circuit an insulating coating and without having formed therein the electric contact holes necessary for producing the connections.

More specifically, the present invention relates to a method for the interconnection of the active zones and/or gates of CMOS integrated circuits, wherein, during the formation of the gates in a first conductive coating, in the latter are defined the dimensions of the connections to be produced, and wherein following the formation of the active zones, the gates are laterally insulated and then a second conductive coating producing the desired connections is deposited on the complete circuit, with the exception of the lateral insulation.

Due to the fact that the method of the invention obviates the deposition of the insulating coating during the formation of the connections of the C/MOS integrated circuits, as well as the formation of the electric contact holes in said insulating coating makes it possible, compared with the prior art methods, to significantly increase the integration density of such circuits.

The method according to the invention can be advantageously used for effecting short distance connections, i.e. connections between sources and drains and/or gates of transistors of C/MOS integrated circuits.

According to a special embodiment of the method according to the invention, the following stages are performed:

definition of the dimensions of the connections to be formed and simultaneously forming the gates of the integrated circuits in the first conductive coating, formation of the active zones by ion implantation, isotropic deposition of an insulating coating of the structure obtained, anisotropic etching of the insulating coating, in order to obtain on the etched sides of the first conductive coating, insulating strips having a width defined by the thickness of insulating coating, elimination of the insulation strips on either side of the connections to be formed, while retaining those on the sides of the gates, and selective deposition of the second conductive coating on the complete integrated circuit with the exception of the remaining insulating strips.

Advantageously, as the active zones are produced in a monocrystalline silicon substrate by the first polycrystalline silicon conductive coating and the lateral insulation of the silicon oxide gates, the second conductive coating is deposited by a chemical vapour phase deposition of tungsten under conditions such that the tungsten is selectively deposited on the active zones and the first conductive coating and not on the lateral insulation.

Moreover, in order to obviate risks of short-circuits between the sources and drains of the integrated circuits and the substrate thereof, particularly on each of the field oxides, it is advantageously possible to carry out an ion implantation in the active zones to be contacted, after laterally insulating the circuit gates.

BRIEF DESCRIPTION OF THE DRAWINGS

The invention is described in greater detail hereinafter relative to non-limitative embodiments and with reference to the attached drawings, which show.

DETAILED DESCRIPTION OF THE PREFERRED EMBODIMENT

The method will be described relative to the connection of the drain of a n channel transistor to the drain of a p channel transistor, said two transistors constituting a C/MOS inverter. Obviously, this is only an example of the connections which can be obtained by the method according to the invention and all other connection types and particularly that making it possible to connect the gates of the integrated circuit transistors to the sources and/drains thereof can also be envisaged.

FIGS. 2 to 6 show a semiconductor substrate 30, more particularly made from monocrystalline silicon, which has a p type region in which will be formed the n channel transistor of the inverter, as well as a n type region, in which will be formed the p channel transistor of said same inverter, together with the field oxide 32 of the integrated circuit. The field oxide 32, e.g. produced according to LOCOS technology (local oxidation of substrate) is shown partly embedded in the semiconductor substate 30, but there is no need for the embedding thereof.

Figure 1:
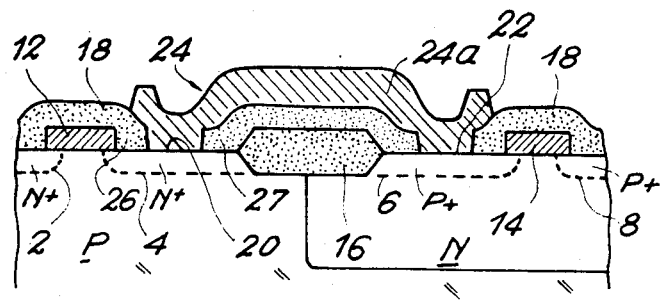
FIG. 1 already described, in longitudinal sectional form a C/MOS inverter illustrating the interconnection method for such a circuit, according to the prior art.
Figure 2:
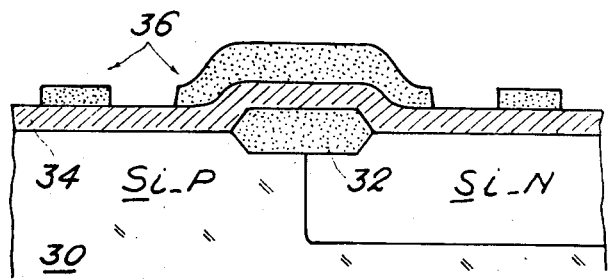
FIGS. 2 to 6 in longitudinal sectional form, the various stages of the connection method according to the invention in accordance with a special embodiment.

After placing an oxide coating on substrate 30, said coating not being shown in order to simplify the drawings and which, in fact, constitutes the gate oxide, a conductive coating 34, called the first coating and which is, e.g. of polycrystalline silicon, is deposited on the complete integrated circuit, as shown in FIG. 2. Coating 34, which is, e.g. deposited by the vapour phase chemical deposition process, can have a thickness of 0.4 µm.

This is followed by the definition within the conductive coating 34, particularly by the etching of said coating, of the dimensions of the connections to be produced and particularly those of the connection of the n channel transistor drain to the p channel transistor drain. Etching can be carried out by means of a mask 36 formed in a resin coating, according to conventional photolithography processes and representing, inter alia, the image of the connection to be formed, whilst eliminating in the manner shown in FIG. 3, those parts of the conductive coating 34 which are free from the mask. This elimination can e.g. take place by chemical etching, particularly with KOH as the etching agent, when coating 34 is made from silicon, or by reactive ionic etching with sulphur hexafluoride. Finally, the resin mask 36 is eliminated, e.g. by means of an oxygen plasma.

Figure 3:
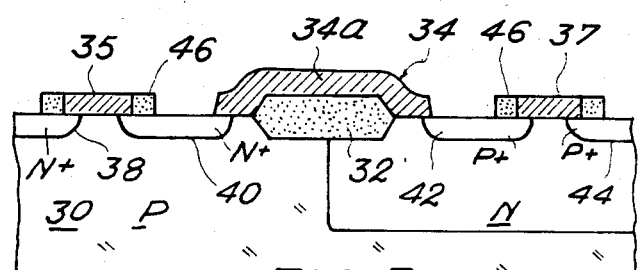

In FIG. 3, the region of the conductive coating 34 making it possible to define the dimensions of the connection to be made carries the reference numeral 34a.

The etching of the conductive coating 34 also makes it possible to simultaneously produce the gates of the integrated circuit transistors such as gates 35, 37 respectively of the n channel transistor and the p channel transistor of the C/MOS inverter, the size of these gates being defined by mask 36.

Following the etching of the conductive coating 34, the active zones of the integrated circuit are produced in a conventional manner in semiconductor substrate 30 by successive ion implantations. These implantations are carried out by, on each occasion, masking the complementary regions of the substrate, in order to obtain type n+ zones 38 and 40, respectively constituting the source and drain of the n channel transistor, and type p+ zones 42 and 44, respectively constituting the source and drain of the p channel transistor.

Following the formation of active zones 38, 40, 42 and 44 of the inverter, gates 35 and 37 are laterally insulated so as to give rise to insulating strips 46, which are preferably of silicon oxide and have a width of 0.25 µm. The obtaining of this lateral insulation will be described hereinafter with reference to FIGS. 5 and 6.

Following this lateral insulation 46 of the gates, further ion implantations will be possibly carried out in the active zones to be connected, such as drains 40 and 42 respectively of the n and p channel transistors. These implantations, which are carried out by, on each occasion, masking the complementary n+ and p+ regions, make it possible to avoid the formation of short-circuits between the sources, drains and the substrate, particularly at the edge of the field oxide. At the integrated circuit gates 35, 37, they also make it possible to obtain a double junction of sources and drains, which makes it possible to reduce the electric field between the adjacent gates and drains of the circit transistors. The implantations are e.g. carried out with arsenic, an energy of 130 keV and a dose of $5.10^{15}$ atoms/cm$^2$ for the n+ zones and BF$_2$ with an energy of 40 keV and a dose of $3.10^{15}$ atoms/cm$^2$ for the p+ zones.

Figure 4:
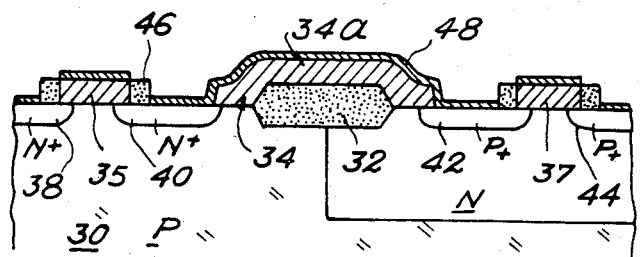

These implantations are followed by the deposition, in the manner shown in FIG. 4, of a conductive coating 48 on the complete integrated circuit, with the exception of the insulating strips 46, i.e. particularly on gates 35, 37 and regions 34a of conductive coating 34, as well as on the n+ zones 38, 40 and p+ zones, 42, 44.

Preferably, the conductive coating 48 forming the connection between drains 40, 42, respectively, of the n channel transistor and the p channel transistor is made from tungsten. The deposition of the tungsten coating advantageously takes place by a chemical vapour deposition process (CVD or LPCVD), in which a way that the tungsten is selectively deposited on the monocrystalline and polycrystalline silicon zones and not on the oxidized regions. This coating has in particular a thickness of 0.1 µm.

The CVD or LPCVD deposition of a conductive tungsten coating 48 makes it possible to directly obtain, i.e. without masking or etching, the desired connections and particularly the connection of inverter drains 40, 42 when the insulating strips 46 are made from silicon oxide, the conductive coating 34 of polycrystalline silicon and the active zones such as drains 40, 42 from a monocrystalline silicon substrate 30. Such a deposit is described in the article by Miller et al in "Solid State Technology", December 1982, entitled "CVD tungsten interconnect and contact barrier technology for VLSI".

This selective deposition process has the advantage of bringing about a self-alignment of the connection to be produced on the active zones to be connected. In a self-aligned manner, it is possible to produce on the gates of the integrated circuits such as 35 and 37, the shunts thereof.

A description will now be given, with reference to FIGS. 5 and 6, of a special embodiment of the lateral insulation of the integrated circuit gates.

Figure 5:
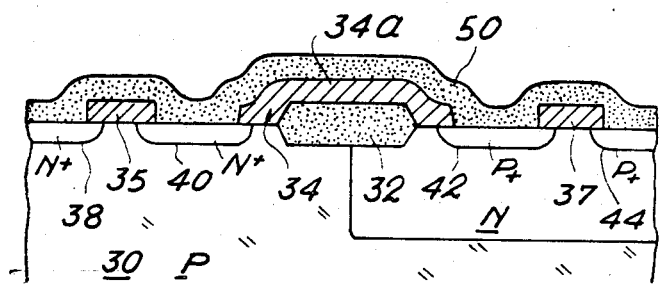

After the formation of the active zones of the circuit, an insulating coating 50, particularly of silicon oxide, is isotropically deposited on the complete integrated circuit, e.g. by chemical vapour phase deposition, as shown in FIG. 5. Insulating coating 50 has a thickness of 0.25 μm.

Figure 6:
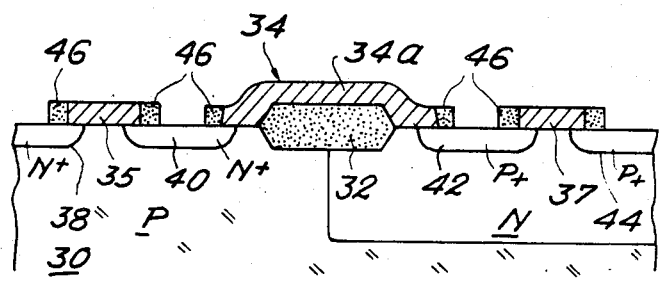

Insulating coating 50 is then etched anisotropically, in the manner shown in FIG. 6, in a single direction in space until the active zones 38, 40, 42 and 44 and gates 35, 37 of the integrated circuit are bared. This anisotropic etching leaves behind only insulating coating 50 at zones 46 on the etched sides of the conductive coating 34, i.e. on the sides of gates 35, 37 and the region 34a of said coating. Etching can e.g. be carried out by reactive ionic etching. Such an etching process makes it possible to obtain insulating sides 46, whose width is defined by the thickness of insulating coating 50. Thus, the isotropic deposition of an insulating coating 50 is 0.25 μm makes it possible to obtain by this etching process insulating strips 46 with a width of 0.25 μm.

For further details on the way in which insulating strips 46 can be made, reference should be made to French Pat. No. 2 525 029, filed by the present Applicant on Aug. 4, 1982. It should be noted that this manner of obtaining the insulating strips is only given in exemplified manner.

After forming an appropriately shaped resin mask on the structure obtained, the insulating strips 46 are locally eliminated, whilst in the circumstances protecting those on the sides of the transistor gates such as 35, 37, and by more particularly eliminating those located on the sides of the corresponding semiconductor coating region 34a for connecting the n+ zone 40 to the p+ zone 42. This elimination can be particularly carried out by chemical etching, e.g. using hydrofluoric acid, when the insulating strips are made of $SiO_2$.

The structure of the circuit following this elimination corresponds to that shown in FIG. 3.

The method according to the invention described hereinbefore makes it possible to connect different active zones of an integrated circuit, such as drains, sources and/or gates of C/MOS integrated circuits, whilst considerably increasing the integration density of the circuits compared with prior art methods because, unlike in the prior art, no contact holes are formed in the insulating coating and there is no metallization or etching of the aluminium. Moreover, the shunts of the gates of these circuits can be produced simultaneously with the connections, said connections and shunts also being self-aligned, respectively on the active zones and the corresponding gates.

The method according to the invention is more particularly applicable to short-distance connections. The prior art connection methods can be used for producing the long distance connections of integrated circuits.

What is claimed is:

1. A method for interconnecting active zones of a CMOS device formed in a semiconductor substrate, comprising successively the following:
    A. depositing a first conductive coating on the entire surface of the substrate;
    B. forming on the first conductive coating a mask pattern defining the locations of the interconnection areas and the locations of gates of the CMOS device, and etching the remaining conductive coating;
    C. forming said active zones by doping the substrate;
    D. removing the mask pattern;
    E. forming insulating strips on sides of the gates adjacent to the substrate; and
    F. depositing a second conductive coating on the entire device except the insulating strips thereby to form interconnections at said interconnection areas.

2. The method according to claim 1 wherein the active zones are formed by ion implantation.

3. The method according to claim 1 wherein the step of forming insulating strips comprises successively the following:
    A. depositing isotropically an insulating coating on the device;
    B. etching the insulating coating anistropically in order to obtain on sides, adjacent to the substrate, of the interconnection areas and gates, insulating strips having a width defined by the thickness of the insulating coating; and
    C. removing the insulating strips on said sides of the interconnection areas.

4. The method according to claim 1 comprising the steps of:
    A. producing the active zones in a monocrystalline silicon substrate;
    B. forming the first conductive coating of polycrystalline silicon;
    C. forming the insulating strips of silicon oxide; and
    D. depositing the second conductive coating by a chemical vapor phase deposition of tungsten so that the tungsten is deposited on the active zones and the first conductive coating, but not on the insulating strips on the etched sides of the gates.

5. A method of interconnecting active zones of a CMOS device formed in a semiconductor substrate comprising successively the following:
    A. depositing a first conductive coating on the entire surface of the substrate;
    B. forming on the first conductive coating a mask pattern defining the locations of the interconnection areas and the locations of gates of the CMOS device, and etching the remaining conductive coating;
    C. forming said active zones by implanting ions in the substrate;
    D. removing the mask pattern;
    E. forming insulating strips on etched sides of the gates adjacent to the substrate; and
    F. depositing a second conductive coating on the entire device except the insulating strips thereby to form interconnections at said interconnection areas.

6. The method according to claim 5 comprising the steps of:
    A. producing the active zones in a monocrystalline silicon substrate;
    B. forming the first conductive coating of polycrystalline silicon;
    C. forming the insulating strips of silicon oxide; and
    D. depositing the second conductive coating by a chemical vapor phase deposition of tungsten so that the tungsten is deposited on the active zones and the first conductive coating, but not on the insulating strips.

7. The method defined in claim 5 including the additional step of effecting further ion implantation in the active zones following formation of the insulating strips.

* * * * *